United States Patent

Le Couturier

[11] 4,007,061
[45] Feb. 8, 1977

[54] THERMOELECTRIC HEAT PUMP

[76] Inventor: Georges Le Couturier, 20, cours d'Herbouville, 69004 Lyon, France

[22] Filed: June 5, 1975

[21] Appl. No.: 584,092

[30] Foreign Application Priority Data

June 5, 1974 France .............................. 74.19360
Feb. 13, 1975 France .............................. 75.04446

[52] U.S. Cl. .................................. 136/221; 62/3; 136/203; 136/204
[51] Int. Cl.² .................. H01L 35/02; H01L 35/04
[58] Field of Search .................. 136/203, 204, 221; 62/3

[56] References Cited

UNITED STATES PATENTS

| 3,075,360 | 1/1963 | Elfving et al. | 136/204 X |
| 3,208,877 | 9/1965 | Merry | 136/221 |
| 3,460,015 | 8/1969 | Hines | 62/3 |
| 3,554,815 | 10/1967 | Osborn | 136/203 |
| 3,726,100 | 4/1973 | Widakowich | 136/203 |

Primary Examiner—Leland A. Sebastian
Attorney, Agent, or Firm—William Anthony Drucker

[57] ABSTRACT

A heat pump having a set of "thermoelements" that have substantially the same thickness and at least two radiant flat elements that permit the diffusion or absorption of the heat, and is characterized by being made in the form of a sandwich comprising, in addition to the said radiant elements, two supports that are electrically insulated and effectively conduct the electricity, placed on either side of the thermoelements, and securing both the electric coupling of the thermoelements to one another and also the thermal coupling of the radiant elements to the thermoelements, while allowing a mechanical coupling of all the elements, each of said supports possessing a first face contacting with its entire surface one of the radiant elements and a second face covered by a layer of discontinuous elements that are effective conductors of electricity, these elements being distributed on the two supports in such a manner that, when the thermoelements are locked between them, the said conductor elements realize the serial coupling of the thermoelements, the coupling points of a first kind being all situated on one of the layers and the coupling points of another kind being all situated on the other layer, and the two end conductor elements of one of the layers being provided with means for coupling to the opposite poles of a continuous source of electric energy, the said sandwich being held by a plurality of locking elements that pass through it from side to side.

8 Claims, 10 Drawing Figures

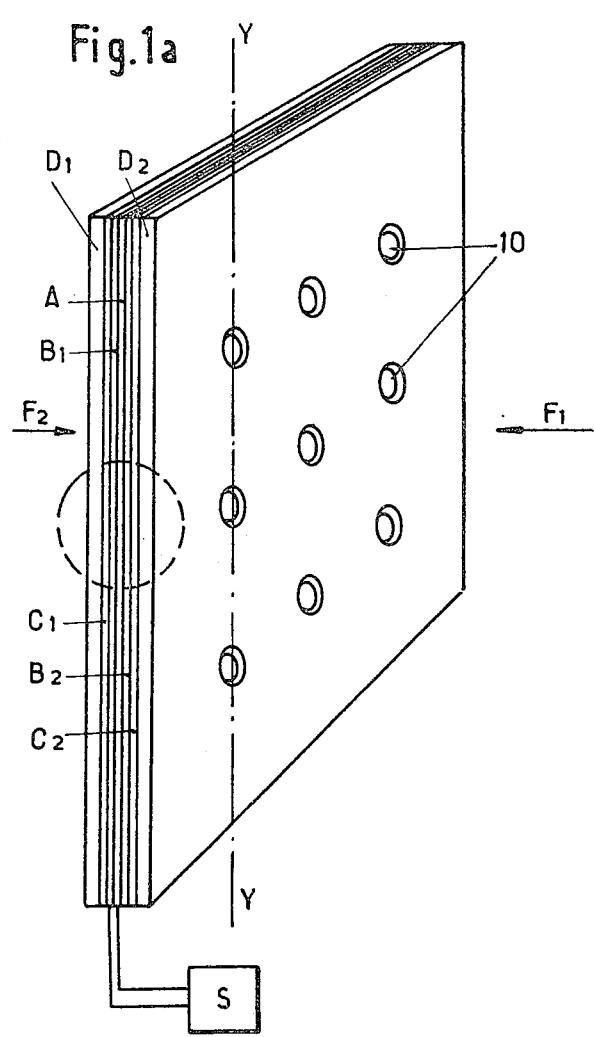
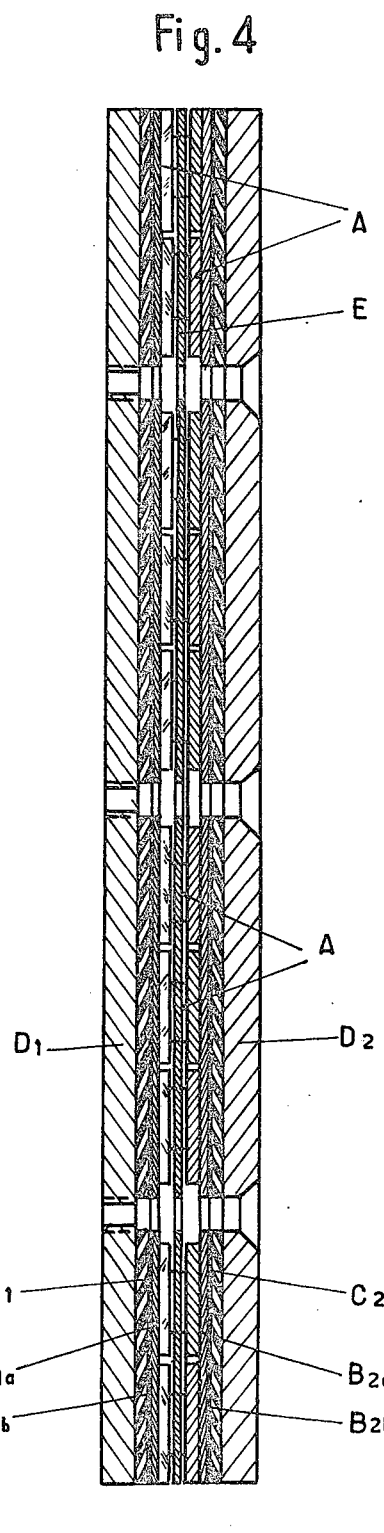
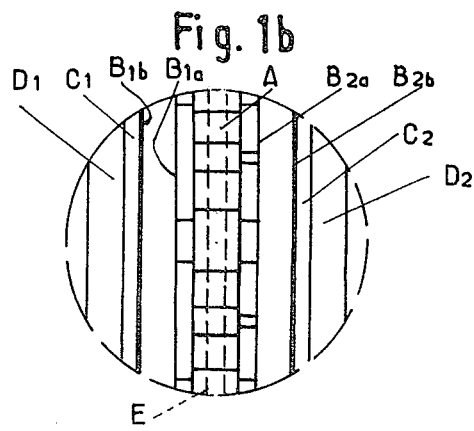

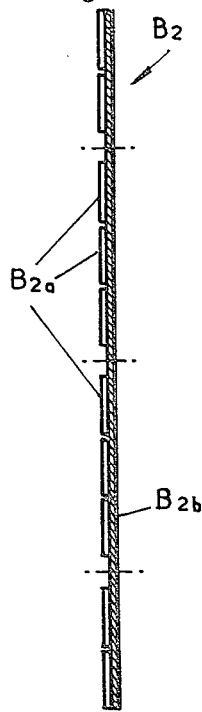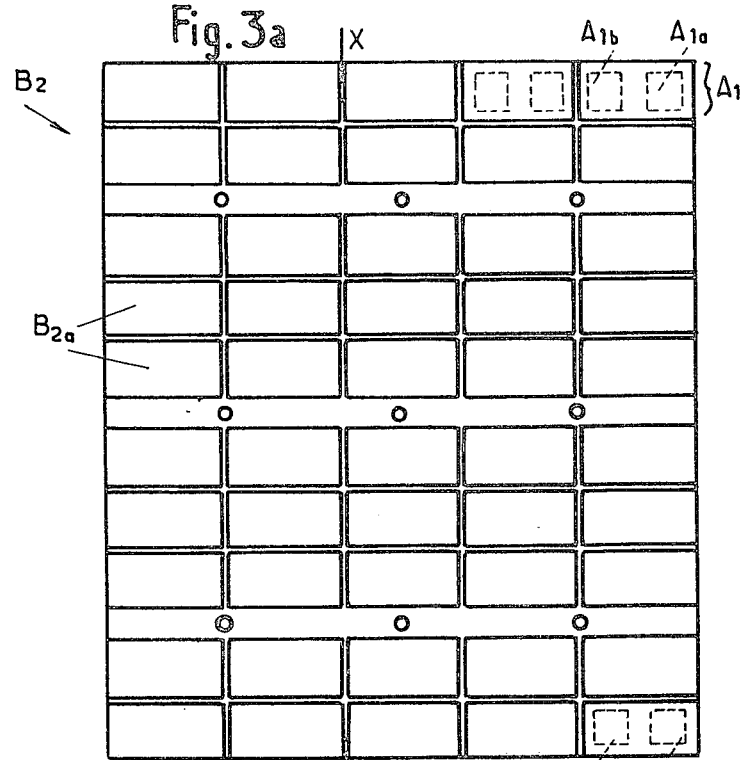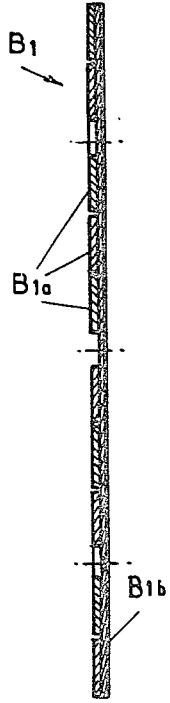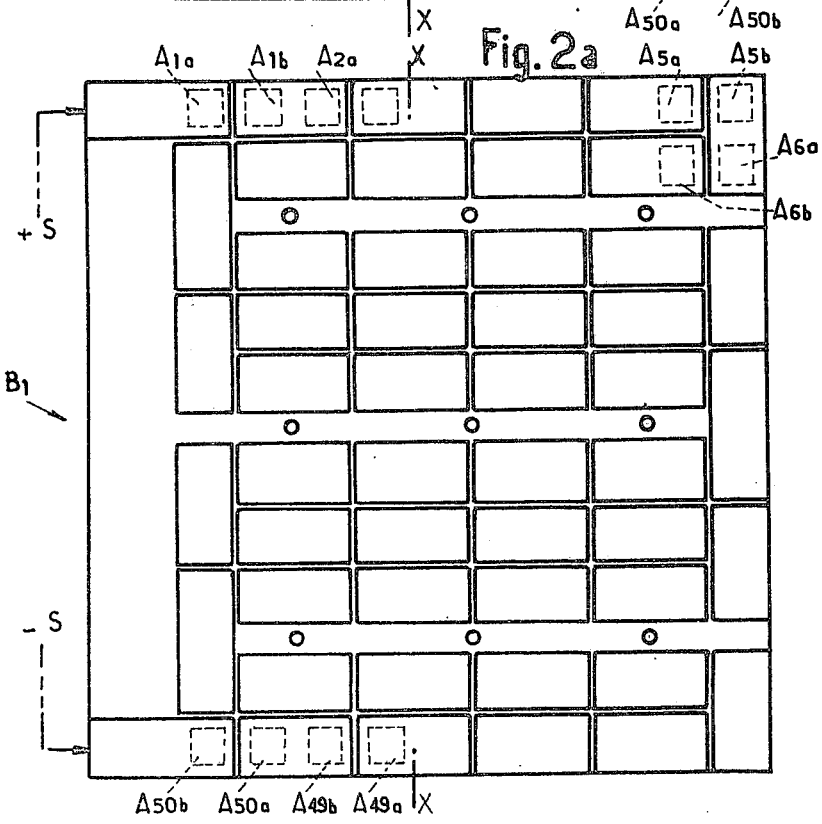

THERMOELECTRIC HEAT PUMP

The invention relates to batteries of thermoelectric elements or "heat pumps" that use the Peltier effect.

Until the present time, the use of thermoelectric batteries was substantially limited to uses wherein the consumption of energy and the weight are the determinative economic factors (i.e. portable refrigerator, equipment carried by air, or medical equipment), the manufacturing cost of such pumps being relatively high due to the fact that after being tinned, each couple or thermoelement must generally be welded precisely, piece by piece, by means of very special welds.

Furthermore, the welds are not resistant to stresses due to differential thermal expansion of the joints between the thermoelements and the support thereof and therefore exert a serious effect on the reliability and the useful life of the batteries.

U.S. Pat. No. 3,208,877, filed June 14, 1962, in the name of Jack D. Merry, proposes to maintain a certain pressure between the battery components in order to improve the electrical and thermal conductivities. However, the practical arrangement described in this patent (use of assembly bolts that are situated outside the battery proper, arranged in the corners of the heat-conducting plates, use of heat-conducting plates of relatively fragile material, transmission of pressure to the joints by means of chloroprene blocks that are relatively soft, complex structure which forms the jacket for the circulation of a cooling liquid) does not allow exertion of pressure higher than a few kg/cm² and the contact can have the required low ohmic resistance only by using an ordinary type of welding, with a deposit of a welding material and an external supply of heat, e.g. through heat steaming.

The invention proposes a novel and compact structure capable of permitting a reliable and inexpensive realization of thermoelectric batteries whose contacts may be realized merely through pressure.

The heat pump of the invention comprises a set of "thermoelements" that have substantially the same thickness and at least two radiant flat elements that permit the diffusion or absorption of the heat, and is characterized by being made in the form of a sandwich comprising, in addition to the said radiant elements, two supports that are electrically insulated and effectively conduct the electricity, placed on either side of the thermoelements, and securing both the electric coupling of the thermoelements to one another and also the thermal coupling of the radiant elements to the thermoelements, while allowing a mechanical coupling of all the elements, each of said supports possessing a first face contacting with its entire surface one of the radiant elements and a second face covered by a layer of discontinuous elements that are effective conductors of electricity, these elements being distributed on the two supports in such a manner that, when the thermoelements are locked between them, the said conductor elements realize the serial coupling of the thermoelements, the coupling points of a first kind being all situated on one of the layers and the coupling points of another kind being all situated on the other layer, and the two end conductor elements of one of the layers being provided with means for coupling to the opposite poles of a continuous source of electric energy, the said sandwich being held by a plurality of locking elements that pass through it from side to side.

The pressure exerted by such locking elements on the contacts between the thermoelectric elements and the said discontinuous conductors practically must be of the order of several tens of kg/cm².

The invention will be explained more in detail in the following description, which is provided by way of example and not by way of limitation, wherein:

FIG. 1a of the attached drawings is a perspective view of a battery of the invention;

FIG. 1b is a partial view on enlarged scale of a portion of FIG. 1a;

FIGS. 2a, 2b and 3a, 3b are front views and sectional views of the battery after the removal of a portion of its elements;

FIG. 4 is a sectional view of FIG. 1 taken along the line Y—Y;

Figure 5A:
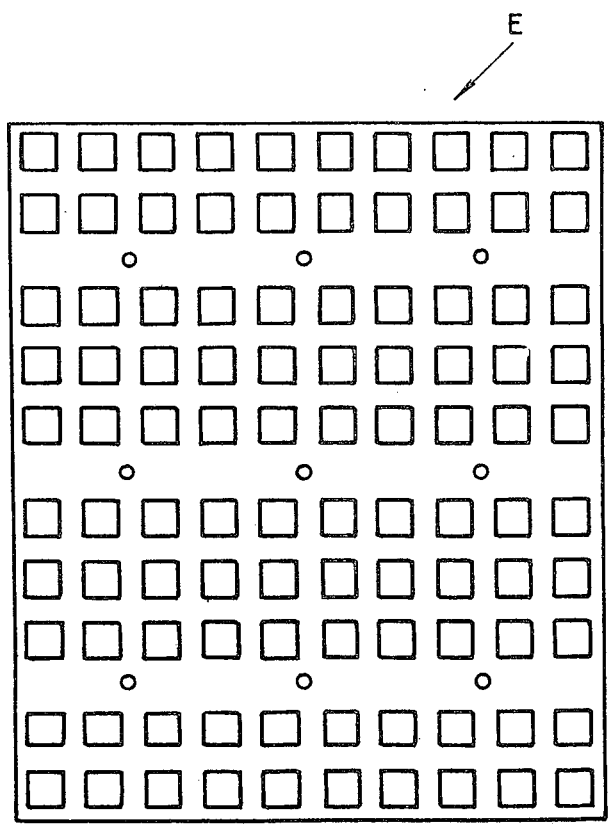
FIGS. 5a and 5b are a front view and a sectional view respectively, of a mounting element of the battery.

The described heat pump is in the compact sandwich form, shown in FIG. 1a, its various elements being held in contact by a locking arrangement consisting of locking screws or bolts, that are not shown in the drawing for the sake of simplicity, and are placed in bores 10 provided for such a purpose. Any other known locking means may also be used.

The pressure exerted in substantially uniform manner at the level of the contacts between the thermoelements and conducting bridges amounts to at least 50 kg/cm² and, preferably, is of the order of 200 kg/cm². The active elements or thermoelements A are placed in the central portion of the sandwich. Such elements are placed between supports $B_1$ and $B_2$, whose cores, having for example the thickness of the order of a few millimeters, comprising an electrically insulating material, which is a good thermal conductor and resistant to compression, e.g., epoxy glass, which presents the additional advantage of a certain elasticity in the transverse direction. The utility of such an elasticity will be explained below.

FIG. 1b, which is an enlarged view of the portion of FIG. 1a surrounded by discontinuous lines, shows in more detail the supports $B_1$ and $B_2$. On their faces turned toward the thermoelements A, such supports are covered with thick and discontinuous metallic layers, $B_{1a}$ and $B_{2a}$ respectively, that form the separate conducting elements whose arrangement and realization will be discussed again below. On the opposite faces there are deposited thin metallic films $B_{1b}$ and $B_{2b}$, having, for example, a thickness of the order of 70 microns. Radiant elements $D_1$ and $D_2$ abut such films, the purpose of the radiant elements being essentially to transmit the heat by radiation or conduction to utilization element, or to maintain, by thermal conduction or absorption, one of the plates at the constant temperature of a cooling source or a source of heat which is not shown. Thin sheets of elastic material which are effective thermal conductors, e.g., rubber filled or not filled with carbon, or, preferably, of a silicone elastomer, $C_1$ and $C_2$ (thickness of the order of a few mm) are inserted with advantage between the radiant elements and the supports in order to provide a better contact surface when the elasticity of the supports and the metallic layers is not sufficient for entirely compensating for the irregularities of thickness of the thermoelements and the supports. The strength or level of forseen current is a factor which determines the thickness of the etched layer $B_{1a}$ or $B_{2a}$ whose resistance should be as low as possible in order to minimize the losses through Joule effect. For example for a strength of 65 amperes one shall take a copper thickness of the order or seven-tenth of millimeter for the contact surfaces with the thermoelements of the order of 10 mm × 10 mm.

In operation, one of the radiant elements is held by any known means at a practically constant temperature (e.g., contact with the ambient air, or liquid in boiling or even an underground water layer) while a source of continuous current S is coupled to the ends of one of the supports, so that the thermoelements are coupled in series with the terminals of the source. It will be noted that FIG. 1$b$ is not on scale, films $B_{1b}$ and $B_{2b}$ being of the order of a hundred microns (70 $\mu$ in the example cited) while the thickness of the thermoelements is of the order of a millimeter (1.5 mm, in particular) and that of the core of the supports is of the order of several millimeters. Finally, an optional grid is shown by means of discontinuous lines E, it may be used for placing the elements.

The films etched layers will preferably be made of copper, which is a metal that is a good thermal and electric conductor and possesses a certain elasticity that provides a better contact on locking, together with the elasticity of the core $B_1$ $B_2$ of the support.

Although it is more advantageous in practice to make the conductor elements $B_{1a}$ and $B_{2a}$ by electrolytic deposition and etching, the invention obviously is not restricted to such modes of manufacture. In addition to glue-bonding a laminate which is then engraved, any other mode of manufacture may be used: electrolytic deposition without etching by using a mask, or glue-bonding by means of a grid for positioning the separated laminated elements. In the case where the network of connections is made by etching, where the copper layer must be thick, it may be advantageous to effect the etching after only a portion of the required thickness is deposited. The thickness is increased by a second deposition after the etching.

FIGS. 2$a$ and 3$a$, respectively, show the examples of etched circuits $B_{1a}$ and $B_{2a}$ of FIG. 1, seen respectively according $F_1$ of FIG. 1$a$, after the removal of the portions A, $B_2$, $C_2$ and $D_2$, and according to $F_2$ of FIG. 1$a$ after the removal of the portions A, $B_1$, $C_1$ and $D_1$.

FIGS. 2$b$ and 3$b$ are sectional views of supports $B_1$ and $B_2$ along lines X—X of FIGS. 2$a$ and 3$a$ respectively and FIG. 4 is a sectional view of the pump or battery assembly along lines Y—Y of FIG. 1$a$. In all these Figures, the same reference numerals indicate the same elements.

In order to show more clearly the manner in which the etched circuits $B_{1a}$ and $B_{2a}$ provide the connections between the thermoelements, FIGS. 3$a$ and 3$b$ show in discontinuous lines a few of the thermoelements, indicated by $A_1, A_2 \ldots A_{49}, A_{50}$. Each thermoelement comprises two components, marked $a$ and $b$, of different thermoelectric nature. The connection of two elements $a$, $b$, of one and the same thermoelement $A_i$ ($i = 1,2,\ldots n$, $n$ being 50 in this case) is realized by means of etched conductor elements $B_{2ai}$ ($i=1,2,\ldots n$), while that of two elements, $b$, $a$, belonging to two successive thermoelements is realized by one of conductor elements $B_{1aj}(j = 1,2, \ldots n + 1)$ the first and the last of such elements being coupled, as shown to the terminals of a generator of direct current S. The junctions or connections from $a$ to $b$ form the junctions of a first kind and the junctions from $b$ to $a$ form the junctions of a second kind. Such junctions may be called respectively "hot" and "cold" for a given direction of current and called inversely for the opposite direction of current.

In order to avoid the occurrence of oxidation at the junctions of the thermoelements during use, the conductor surfaces $B_{1a}$ and $B_{2a}$ should be treated in a suitable manner.

According to a preferred embodiment, the complementary conductor surfaces of the junction are treated with indium.

It is known that indium is a good metallic protector against oxidation. However, the high capacity of diffusion of such a material when deposited in a very thin layer is generally considered a disadvantage.

On the other hand, in the thermoelectric battery which is being described, such a capacity of diffusion is an advantage which is used for improving the contact between the thermoelements and the conductor layers on which indium is deposited electrolytically. A deposition of nickel is effected with advantage prior to the deposition of indium on the discontinuous elements in order to prevent too rapid penetration of indium into the copper. In this embodiment, a contact of sufficient quality is produced immediately through a simple pressure and this effect is improved in the course of time due to the diffusion of indium.

According to another embodiment, commercially available thermoelements that are generally tinned are assembled without preliminary treatment. It is sufficient to obtain a temperature of the order of 140° to 160° C, which is lower than the maximum temperature (200° C minimum) that can be tolerated by the components of the battery. If necessary, in order to produce a welding effect through the Joule effect, without using another actual operation of welding, with the introduction of external heat, one can simply tin the metallic layers prior to assembly. It will be noted that the Joule effect welding, which is particularly advantageous, is possible and effective only because the elements to be joined are in excellent mechanical contact due to their manner of assembly through pressure and because there was no introduction of an insulating material (resin or flux) which may prevent the flow of current.

Of course, such welding is not indispensable, the contact being substantially realized through pressure.

Figure 5B:
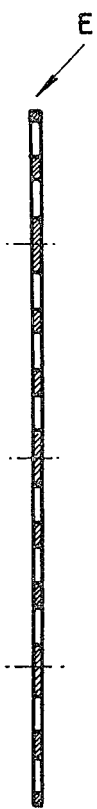

As indicated above, the positioning of the thermoelements A between pieces $B_1$ and $B_2$ may be realized with advantage through a positioning grid E as shown schematically in FIGS. 5$a$ and 5$b$. Such a grid may be cut, for example, mechanically or chemically of a suitable material, i.e., electrically insulating and preferably also thermally insulating material. It may also be extruded into a mold. The thickness of the grid should in any event be lower than that of the thermoelements, e.g., of the order of one half of the thickness of the thermoelements.

The metallized films $B_{1b}$, $B_{2b}$ are employed for improving the quality of thermal contact and are not strictly indispensible. The same is true for elastic layers $E_1$, $E_2$, whose utility depends on the tolerance obtained in the different thicknesses of the set. On the other hand, it is of essential importance that one and the same support, through the effect of a sufficient pressure, secure the electrical interconnection of the thermoelements and their thermal coupling to the radiant elements.

In the thermoelectric heat pumps of a type that is different from the one described herein, it has been proposed to equip the radiant elements with fins in order to improve the exchange of heat properties. One eliminates the thermal losses in this manner, the fins being an integral part of the battery.

Figure 6:
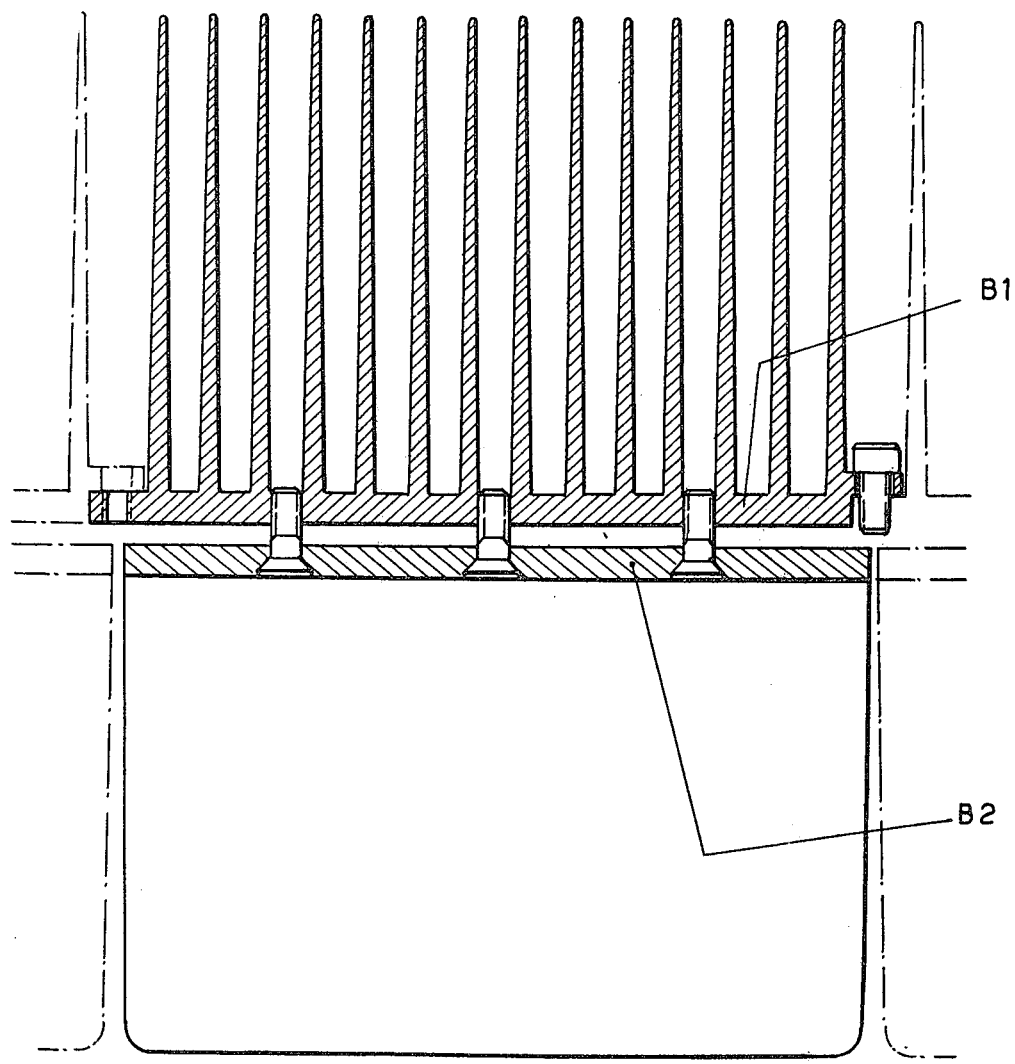
FIG. 6 shows a modification of the battery.

According to the preferred embodiment shown in FIG. 6, which may be advantageously combined with one of the preceding embodiments, supports $B_1$, $B_2$ for locking and coupling the thermoelements are equipped with fins on their outer faces, as illustrated in partial section, the two supports being indicated generally by $B_1$, $B_2$ while the arrangement of the thermoelements locked between $B_1$ and $B_2$ are not shown. This monolithic structure of the heat-conducting and exchanging elements contributes to a great rigidity of support plates $B_1$, $B_2$, which is advantageous for exerting a sufficient pressure on the contacts.

The invention is of particular importance for separate air conditioners, as it allows their entirely silent operation, with utilization of energy that is competitive in regard to the use of compressors.

What is claimed is:

1. A heat pump comprising a set of thermoelements that are substantially of the same thickness and at least two flat radiant elements to provide diffusion or absorption of heat, the said pump being made in sandwich form comprising, in addition to the said radiant elements, two electrically insulating supports that are good heat conductors, said supports being disposed on either side of the thermoelements and providing both the electrical coupling of the thermoelements to one another and the thermal coupling of the radiant elements to the thermoelements, while producing a mechanical coupling of the arrangement of all the elements, each of said supports having a first face contacting with its entire surface one of the radiant elements and a second face covered by a layer of discontinuous electrically conducting elements separated by gaps, such elements being disposed on the two supports in such a manner that, the thermoelements being located between them in contact thereof, the said conductor elements produce the serial coupling of the thermoelements, the coupling points of a first thermoelectric kind being all situated on one of the layers and the coupling points of the other thermoelectric kind being all situated on the other of said layers and the two end conductor elements of one of the layers being provided with means for coupling to the opposite poles of a source of continuous electric current, and a plurality of locking members passing through the said sandwich in the said gaps, said locking members exerting a substantially uniform pressure at the level of the contacts between the thermoelements and the said discontinuous conductor elements and at least one thin sheet of good thermal conductor elastic material disposed between one of the radiant elements and the face of the support which faces the radiant elements.

2. A heat pump as claimed in claim 1, wherein the said pressure is higher than 50 kg/cm$^2$.

3. A heat pump as in claim 1, wherein the said first faces are covered with a thin metallic film.

4. A heat pump as in claim 3, wherein the discontinuous elements are produced by electrolytic deposition of a metallic layer on the said second face and by etching of the said layer.

5. A heat pump as in claim 4, wherein the surfaces of the discontinuous elements and the thermoelements are covered by a coating of indium.

6. A heat pump as in claim 4, wherein the thermoelements are tinned, thus permitting their welding to the said discontinuous elements by the Joule effect due to the passage of current when the thermoelements are put into operation.

7. A heat pump as in claim 6, wherein the radiant elements are equipped with fins that are integral therewith.

8. A heat pump as claimed in claim 5, wherein the said pressure is of the order of 200 kg/cm$^2$.

* * * * *